US012553146B2

(12) United States Patent
Ebner et al.

(10) Patent No.: US 12,553,146 B2
(45) Date of Patent: Feb. 17, 2026

(54) METHOD FOR GROWING SINGLE CRYSTALS

(71) Applicant: EBNER Industrieofenbau GmbH, Leonding (AT)

(72) Inventors: Robert Ebner, Leonding (AT); Kanaparin Ariyawong, Leonding (AT); Ghassan Barbar, Neunkirchen (DE); Chih-Yung Hsiung, Leonding (AT)

(73) Assignee: EBNER Industrieofenbau GmbH, Leonding (AT)

(*) Notice: Subject to any disclaimer, the term of this patent is extended or adjusted under 35 U.S.C. 154(b) by 376 days.

(21) Appl. No.: 18/028,684

(22) PCT Filed: Sep. 23, 2021

(86) PCT No.: PCT/AT2021/060342
§ 371 (c)(1),
(2) Date: Mar. 27, 2023

(87) PCT Pub. No.: WO2022/061387
PCT Pub. Date: Mar. 31, 2022

(65) Prior Publication Data

US 2023/0357952 A1 Nov. 9, 2023

(30) Foreign Application Priority Data

Sep. 28, 2020 (AT) .................................. 50820/2020

(51) Int. Cl.
*C03B 23/02* (2006.01)
*C30B 23/02* (2006.01)
*C30B 29/36* (2006.01)

(52) U.S. Cl.
CPC .............. *C30B 23/02* (2013.01); *C30B 29/36* (2013.01)

(58) Field of Classification Search
CPC ....... C30B 23/02; C30B 29/36; C30B 35/002; C30B 23/00
(Continued)

(56) References Cited

U.S. PATENT DOCUMENTS 4,578,146 A 3/1986 Chai et al.
5,958,132 A * 9/1999 Takahashi ............... C30B 29/36 117/109
(Continued)

FOREIGN PATENT DOCUMENTS

CN 101003914 A 7/2007
CN 102596804 A 7/2012
(Continued)

OTHER PUBLICATIONS

International Search Report in PCT/AT2021/060339, mailed Dec. 21, 2021.
(Continued)

*Primary Examiner* — Rudy Zervigon
(74) *Attorney, Agent, or Firm* — Collard & Roe, P.C.

(57) ABSTRACT

A method for growing single crystals, in particular silicon carbide single crystals, uses a device including a crucible, the crucible defining an outer surface and delimiting a receptacle having an axial extent between a bottom portion and an opening portion. The receptacle is designed for crystal growth and at least one seed crystal layer is located in the opening portion, the seed crystal layer being weighed down by a weighting mass at a side remote from the receptacle and being fixed, in particular exclusively, by the weight force of the weighting mass in its position against at least one holding portion located in the opening portion.

10 Claims, 2 Drawing Sheets

(58) Field of Classification Search
USPC ....... 117/84, 951, 109, 200, 95, 208, 13, 94, 117/100, 915, 911; 118/726, 723 VE
See application file for complete search history.

(56) References Cited

U.S. PATENT DOCUMENTS

| | | | | |
|---|---|---|---|---|
| 5,985,024 | A * | 11/1999 | Balakrishna | C30B 23/00 117/951 |
| 6,048,398 | A | 4/2000 | Vehanen et al. | |
| 6,113,692 | A * | 9/2000 | Jaussaud | C30B 29/36 117/109 |
| 6,723,166 | B2 | 4/2004 | Kuhn et al. | |
| 6,780,243 | B1 | 8/2004 | Wang et al. | |
| 7,767,022 | B1 * | 8/2010 | Gupta | C30B 33/02 117/109 |
| 9,816,200 | B2 | 11/2017 | Masuda et al. | |
| 10,793,972 | B1 * | 10/2020 | Xu | C30B 29/36 |
| 11,078,599 | B2 | 8/2021 | Jang et al. | |
| 12,163,250 | B1 * | 12/2024 | Bondokov | C30B 23/00 |
| 2002/0083892 | A1 * | 7/2002 | Kondo | C30B 23/00 117/109 |
| 2003/0029376 | A1 | 2/2003 | Snyder et al. | |
| 2004/0241343 | A1 * | 12/2004 | Nishino | C30B 29/36 427/589 |
| 2006/0213430 | A1 * | 9/2006 | Jenny | C30B 23/00 117/945 |
| 2008/0067524 | A1 * | 3/2008 | Basceri | C30B 23/005 257/E29.345 |
| 2009/0205565 | A1 * | 8/2009 | Nakabayashi | C30B 23/066 117/217 |
| 2010/0024719 | A1 | 2/2010 | Vanmil et al. | |
| 2011/0155048 | A1 * | 6/2011 | Kojima | C30B 25/14 118/716 |
| 2011/0226182 | A1 | 9/2011 | Sasaki et al. | |
| 2012/0000415 | A1 | 1/2012 | D'Evelyn et al. | |
| 2012/0025153 | A1 * | 2/2012 | Hirose | C30B 29/36 252/516 |
| 2012/0060749 | A1 * | 3/2012 | Okuno | C30B 29/36 118/726 |
| 2012/0103249 | A1 * | 5/2012 | Gupta | C30B 29/36 117/89 |
| 2012/0152165 | A1 * | 6/2012 | Hara | C30B 25/14 117/106 |
| 2012/0285370 | A1 | 11/2012 | Gupta et al. | |
| 2013/0157442 | A1 | 6/2013 | Bondokov et al. | |
| 2013/0174784 | A1 | 7/2013 | Kondo | |
| 2013/0327265 | A1 | 12/2013 | Inoue et al. | |
| 2014/0165905 | A1 * | 6/2014 | Kim | C30B 35/002 118/715 |
| 2014/0352607 | A1 | 12/2014 | Kim et al. | |
| 2014/0363607 | A1 | 12/2014 | Sato et al. | |
| 2016/0002820 | A1 | 1/2016 | Hori et al. | |
| 2016/0160386 | A1 | 6/2016 | Masuda et al. | |
| 2016/0215414 | A1 * | 7/2016 | Nakabayashi | H10D 62/53 |
| 2016/0233080 | A1 * | 8/2016 | Tanaka | H01L 21/02021 |
| 2017/0121844 | A1 * | 5/2017 | Kawase | C30B 23/025 |
| 2017/0145591 | A1 | 5/2017 | Yoshida | |
| 2018/0057925 | A1 | 3/2018 | Ma et al. | |
| 2018/0066380 | A1 | 3/2018 | Tani et al. | |
| 2018/0290893 | A1 | 10/2018 | Dukes et al. | |
| 2019/0330765 | A1 * | 10/2019 | Fujikawa | C30B 25/105 |
| 2020/0017990 | A1 * | 1/2020 | Noguchi | C23C 14/0635 |
| 2020/0123678 | A1 | 4/2020 | Ko et al. | |
| 2020/0149190 | A1 | 5/2020 | Fujikawa | |
| 2020/0182752 | A1 * | 6/2020 | Noguchi | G01N 23/205 |
| 2020/0190698 | A1 * | 6/2020 | Jang | C30B 35/002 |
| 2020/0199777 | A1 | 6/2020 | Drachev et al. | |
| 2020/0255973 | A1 * | 8/2020 | Choi | C30B 29/36 |
| 2020/0354856 | A1 | 11/2020 | Gao et al. | |
| 2021/0115587 | A1 * | 4/2021 | Park | C09J 7/30 |
| 2021/0115592 | A1 * | 4/2021 | Park | C01B 32/956 |
| 2021/0123157 | A1 * | 4/2021 | Park | C23C 14/588 |
| 2021/0123843 | A1 * | 4/2021 | Park | C30B 23/002 |
| 2021/0127462 | A1 * | 4/2021 | Yang | C30B 29/36 |
| 2021/0172085 | A1 * | 6/2021 | Matsuse | C30B 29/36 |
| 2021/0230768 | A2 * | 7/2021 | Fujikawa | C30B 23/06 |
| 2021/0272793 | A1 * | 9/2021 | Park | H01L 21/02433 |
| 2021/0301420 | A1 * | 9/2021 | Soltani | C30B 29/36 |
| 2021/0372003 | A1 * | 12/2021 | Jang | C30B 29/36 |
| 2021/0372005 | A1 * | 12/2021 | Park | C30B 33/10 |
| 2021/0388527 | A1 * | 12/2021 | Park | C30B 23/025 |
| 2022/0010457 | A1 | 1/2022 | Ebner et al. | |
| 2022/0020852 | A1 * | 1/2022 | Park | H01L 21/02529 |
| 2022/0064817 | A1 * | 3/2022 | Park | C30B 23/06 |
| 2022/0090295 | A1 * | 3/2022 | Park | C30B 29/36 |
| 2022/0403551 | A1 * | 12/2022 | Choi | H10D 62/57 |
| 2023/0203708 | A1 * | 6/2023 | Park | C30B 29/36 117/84 |
| 2023/0332330 | A1 * | 10/2023 | Ebner | C30B 29/36 |
| 2023/0357952 | A1 * | 11/2023 | Ebner | C30B 29/36 |
| 2023/0392285 | A1 * | 12/2023 | Shonai | C30B 33/10 |
| 2023/0392287 | A1 * | 12/2023 | Shonai | C30B 23/002 |
| 2023/0392293 | A1 * | 12/2023 | Shonai | C30B 23/02 |
| 2023/0416939 | A1 * | 12/2023 | Ecker | C30B 23/025 |
| 2024/0035200 | A1 * | 2/2024 | Ebner | C30B 25/183 |
| 2024/0068125 | A1 * | 2/2024 | Shiomi | C30B 29/36 |
| 2024/0158948 | A1 * | 5/2024 | Von Dollen | C30B 29/36 |
| 2024/0254656 | A1 * | 8/2024 | Takaoka | C30B 29/36 |
| 2025/0207295 | A1 * | 6/2025 | Wang | C30B 35/007 |

FOREIGN PATENT DOCUMENTS

| | | | |
|---|---|---|---|
| CN | 103620095 | A | 3/2014 |
| CN | 204982130 | U | 1/2016 |
| CN | 105308223 | A | 2/2016 |
| CN | 106894089 | A | 6/2017 |
| CN | 108374197 | A | 8/2018 |
| CN | 110016718 | A | 7/2019 |
| CN | 110331438 | A | 10/2019 |
| CN | 110541199 | A | 12/2019 |
| CN | 110904509 | A | 3/2020 |
| CN | 111074339 | A | 4/2020 |
| CN | 110541199 | B | 7/2020 |
| CN | 112663134 | A | 4/2021 |
| DE | 3441707 | A1 | 5/1986 |
| DE | 3448179 | C2 | 10/1988 |
| DE | 102015212323 | A1 | 1/2016 |
| DE | 102018129492 | A1 | 5/2020 |
| EP | 3260582 | A1 | 12/2017 |
| EP | 3666934 | A1 | 6/2020 |
| JP | H11268989 | A | 10/1999 |
| JP | 4061700 | B2 | 3/2008 |
| JP | 2012066959 | A | 4/2012 |
| JP | 2015168600 | A | 9/2015 |
| JP | 2018118874 | A | 8/2018 |
| JP | 6640680 | B2 | 2/2020 |
| KR | 20130013709 | A | 2/2013 |
| KR | 20130083654 | A | 7/2013 |
| RU | 2633909 | C1 | 10/2017 |
| TW | 539783 | B | 7/2003 |
| TW | 201504488 | A | 2/2015 |
| TW | 201522727 | A | 6/2015 |
| TW | 201807272 | A | 3/2018 |
| TW | 202018136 | | 5/2020 |
| TW | 202028548 | A | 8/2020 |
| WO | 0104390 | A1 | 1/2001 |
| WO | 2012144872 | A2 | 10/2012 |
| WO | 2013015630 | A2 | 1/2013 |
| WO | 2015012954 | A1 | 1/2015 |
| WO | 2018183585 | A1 | 10/2018 |
| WO | 2019144804 | A1 | 8/2019 |
| WO | 2020087723 | A1 | 5/2020 |

OTHER PUBLICATIONS

International Search Report in PCT/AT2021/060340, mailed Jan. 4, 2022.

International Search Report in PCT/AT2021/060341, mailed Dec. 21, 2021.

International Search Report in PCT/AT2021/060342, mailed Dec. 23, 2021.

(56) References Cited

OTHER PUBLICATIONS

International Search Report in PCT/AT2021/060343, mailed Dec. 10, 2021.
International Search Report in PCT/AT2021/060344, mailed Dec. 6, 2021.

* cited by examiner

METHOD FOR GROWING SINGLE CRYSTALS

CROSS REFERENCE TO RELATED APPLICATIONS

This application is the National Stage of PCT/AT2021/060342 filed on Sep. 23, 2021, which claims priority under 35 U.S.C. § 119 of Austrian Application No. A 50820/2020 filed on Sep. 28, 2020, the disclosure of which is incorporated by reference. The international application under PCT article 21(2) was not published in English.

BACKGROUND OF THE INVENTION

1. Field of the Invention

The invention relates to a device for growing single crystals, in particular single crystals of silicon carbide, comprising a crucible, which crucible defines an outer lateral surface and moreover delimits an accommodation space with an axial extension between a bottom section and an opening section, wherein the accommodation space is designed for growing the crystals, wherein the device has at least one seed crystal layer.

2. Description of the Related Art

For many technical applications, single crystals are nowadays produced on an industrial scale. Based on the phase transitions leading to the crystal, a distinction can be made between the growth from the melt, from the solution and from the gas phase. In the case of growth from the gas phase, further distinctions can be made between the production methods of the sublimation and/or the physical vapor deposition and the method of the chemical vapor deposition. In the case of the physical vapor deposition, the substance to be grown is vaporized by means of heating, so that it transitions into the gas phase. Given suitable conditions, the gas can resublimate on a seed crystal, whereby a growth of the crystal takes place. The raw material (powder or granules) usually present in a polycrystalline form is thus recrystallized. The chemical vapor deposition works in a similar manner. In this process, the transition of the substance to be grown into the gas phase is only possible by means of an auxiliary substance, to which the substance chemically binds itself, since the vapor pressure would be too low otherwise. Thus, a higher transport rate towards the seed crystal is achieved in combination with the auxiliary substance.

A great interest is taken in silicon carbide single crystals, particularly because of their semiconductor properties. Their production is carried out in furnaces with a crucible, in which the silicon carbide raw material is heated, and a seed crystal, on which the further crystal growth takes place by means of accumulation. Moreover, the interior of the process chamber is evacuated. The material used for the innermost process chamber with the crucible is graphite. Usually, the seed crystal is located directly on a cover of a crucible containing the raw material.

A problem, which occurs in known methods, is to release the ingot developing during the growth of the crystals from the cover, as in conventional methods, the ingot is grown together with the cover. For this process, cutting or sawing methods are commonly used. Moreover, the emergence of faults in a transition region between the cover and edge regions of the seed crystal is favored by the conventional solutions, since accumulations on side edges of the seed crystal not intended for the crystal growth cannot be provided in known solutions.

SUMMARY OF THE INVENTION

It was the object of the present invention to overcome the disadvantages of the prior art and to simplify the production of single crystals.

This object is achieved according to the invention in that the seed crystal layer is weighted down by means of a weighting mass on a side facing away from the accommodation space and is fixed in its position against at least one holding section of the crucible, in particular only, by means of the weight force of the weighting mass.

The solution according to the invention makes it possible in a simple manner to remove the ingot from the crucible without having to cut off and/or detach the ingot from the cover for this purpose.

In order to cover regions not serving the crystallization, it may be provided that the seed crystal layer abuts on the at least one holding section with at least an outer edge region.

It has proven particularly advantageous that the at least one holding section is formed so as to extend circumferentially around an opening of the opening section.

According to a preferred advancement of the invention, it may be provided that the at least one holding section is formed at least by a section of a mount having an annular or tubular base body, the section facing a longitudinal central axis of the crucible, wherein the at least one holding section projects from the base body.

A particularly reliable positioning of the mount in the crucible provides that the mount is screwed into the crucible.

According to a preferred variant, it may be provided in this regard that the mount comprises an external thread on a lateral surface of the base body, wherein a lateral surface delimiting the opening comprises an internal thread corresponding to the external thread.

In an advantageous embodiment, the weighting mass is arranged between the seed crystal layer and a cover of the crucible, wherein the weighting mass and the cover are formed separately from one another.

It has proven particularly favorable if the weighting mass is arranged loosely between the cover and the seed crystal layer.

A variant of the invention consists in that the at least one seed crystal layer is applied to a carrier substrate, and the weighting mass rests on the carrier substrate.

Advantageously, the carrier substrate may be formed from graphite.

The weighting mass and/or the mount may be made of metal, ceramics, mineral or plastics, in particular of fireproof materials, carbides, oxides, or nitrides.

It is preferably provided that the crucible is arranged in a chamber of an inductively heated furnace.

BRIEF DESCRIPTION OF THE DRAWINGS

For the purpose of better understanding of the invention, it will be elucidated in more detail by means of the figures below.

These show in a respectively very simplified schematic representation.

DETAILED DESCRIPTION OF THE PREFERRED EMBODIMENTS

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

Figure 1:
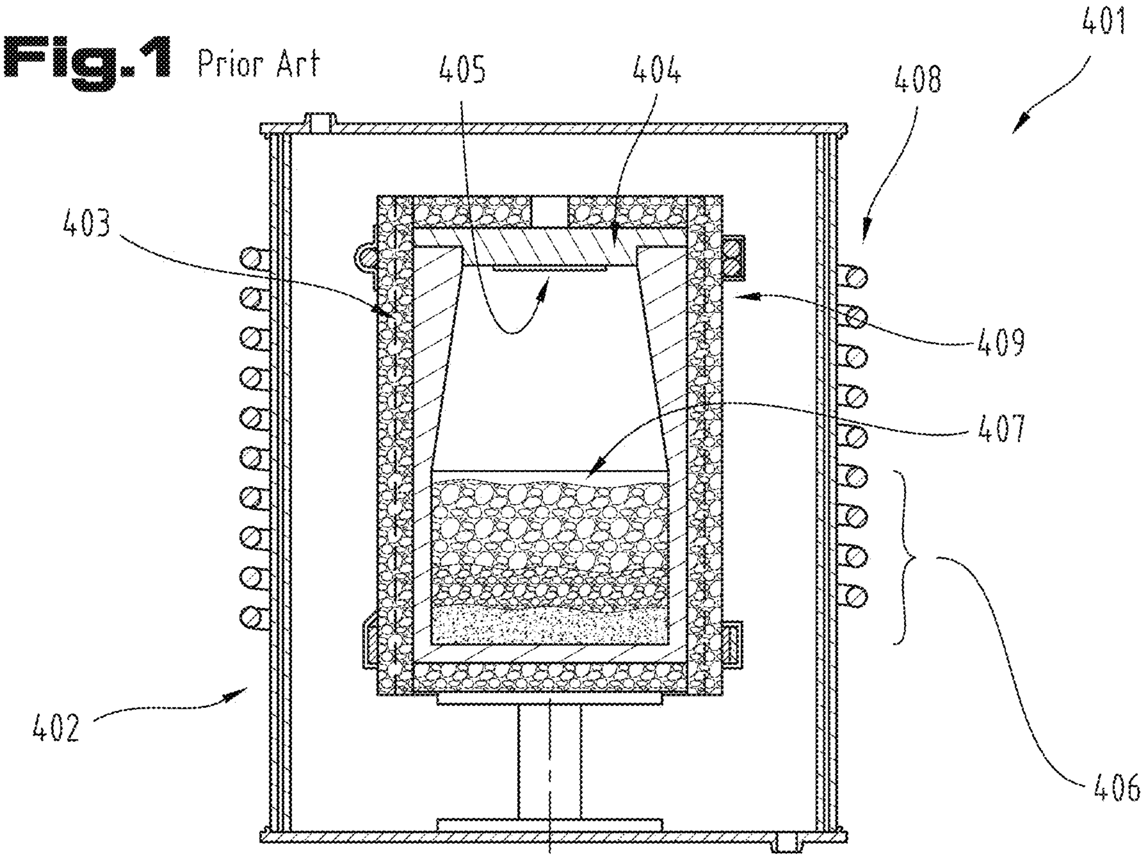
Fig.1 Prior Art
FIG. 1 a device for producing single crystals by means of physical vapor deposition with a conventional arrangement of a seed crystal.

FIG. 1 shows a furnace 401 for producing single crystals by means of physical vapor deposition. The furnace 401 comprises a chamber 402, which can be evacuated, with a crucible 403 accommodated therein. The crucible 403 is designed to be essentially pot-shaped, wherein an upper end region is closed by a cover 404. A bottom side of the cover 404 of the crucible 403 is, in this regard, usually configured to fasten a seed crystal 405. In a bottom region 406 of the crucible 403, a base material 407 is present, which serves as a raw material for the crystal growth on the seed crystal 405, and which is gradually consumed during the production process.

The transition of the base material 407 into the gas phase is achieved by heating with the aid of a heater 408. According to this exemplary embodiment, the heating of the base material 407 and the crucible 403 by means of the heater 408 is carried out inductively. The crucible 403 arranged in the chamber 402 is moreover enveloped by an insulation 409 for thermal insulation. By means of the insulation 409, thermal losses from the crucible 403 are simultaneously prevented, and a heat distribution favorable for the growth process of the crystal on the seed crystal 405 is achieved in the interior of the crucible 403.

The material for the chamber 402 is preferably a glass material, in particular a quartz glass. The crucible 403 and the insulation 409 surrounding it preferably consist of graphite, wherein the insulation 409 is formed by a graphite felt.

Because atoms and/or molecules of the base material 407 transition into the gas phase due to heating of the base material 407, the atoms and/or molecules can diffuse to the seed crystal 405 in the interior of the crucible 403 and accumulate thereon, whereby the crystal growth takes place.

Figure 2:
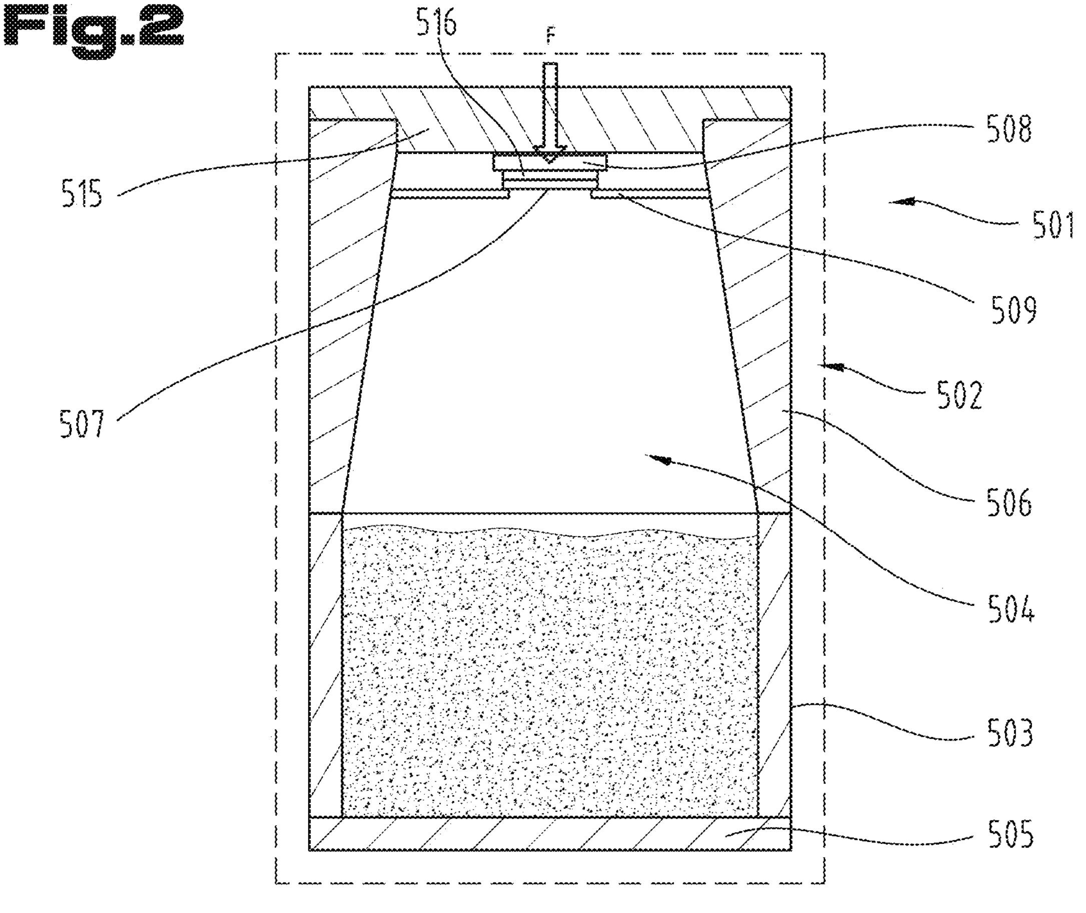
FIG. 2 a section through a crucible of a first variant of a device according to the invention.

According to FIG. 2, the device 501 according to the invention for growing single crystals, in particular single crystals of silicon carbide, comprises a crucible 502. The crucible 502 defines an outer lateral surface 503 and moreover delimits an accommodation space 504 with an axial extension between a bottom section 505 and an opening section 506. The accommodation space 504 is designed for growing the crystals, wherein at least one seed crystal layer 507 is arranged in the opening section 506. The crucible 502 may be arranged in a chamber equivalent to the chamber 402 and also be heated inductively.

Contrary to the embodiment according to FIG. 1, the seed crystal layer 507 is weighted down, according to the invention, by means of a weighting mass 508 on a side facing away from the accommodation space 504 and is fixed in its position against at least one holding section 509 arranged in the opening section by means of the weight force of the weighting mass 508. It is preferably provided that the seed crystal layer 507 is locked into position only by means of the weight force of the weighting mass 508. Apart from this, the device 501 may be designed like the furnace of FIG. 2.

As can further be seen in FIG. 2, the seed crystal layer 507 may contact the at least one holding section 509 with at least an outer edge region.

The holding section 509 may be designed to extend circumferentially around an opening 510 of the opening section 506.

Figure 3:
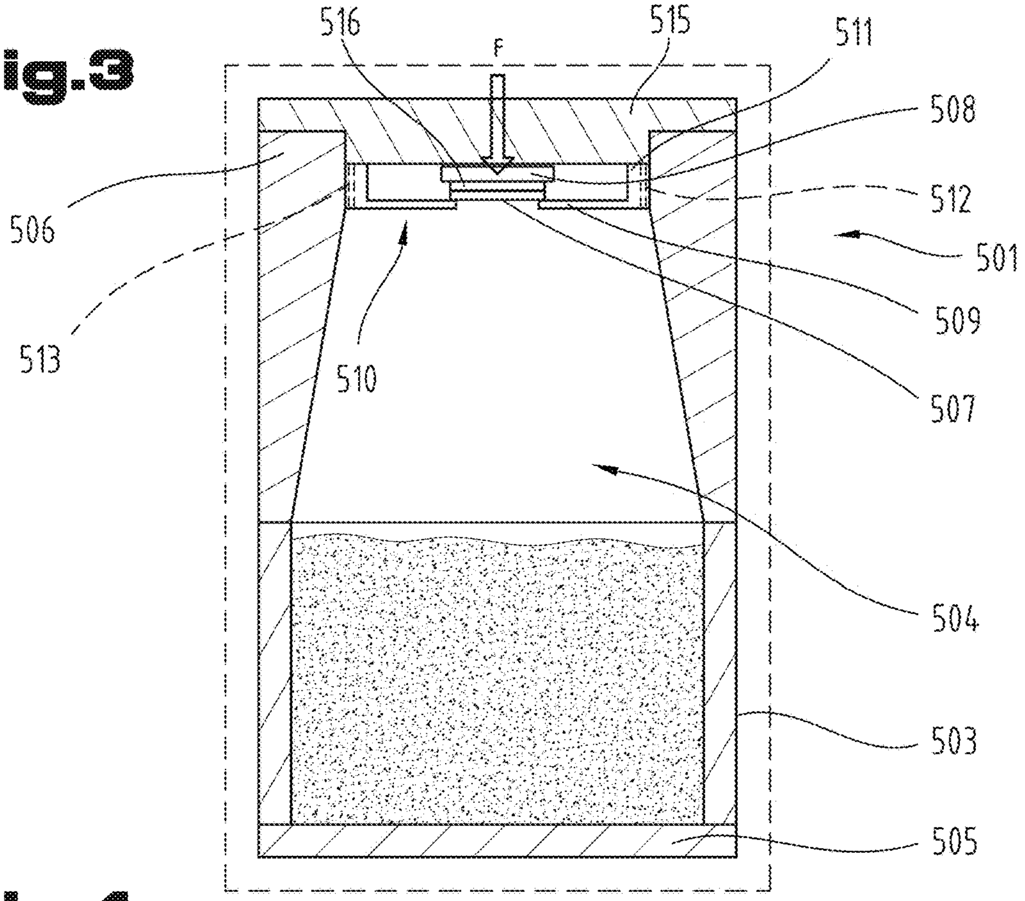
FIG. 3 a section through a crucible of a second variant of a device according to the invention.
Figure 4:
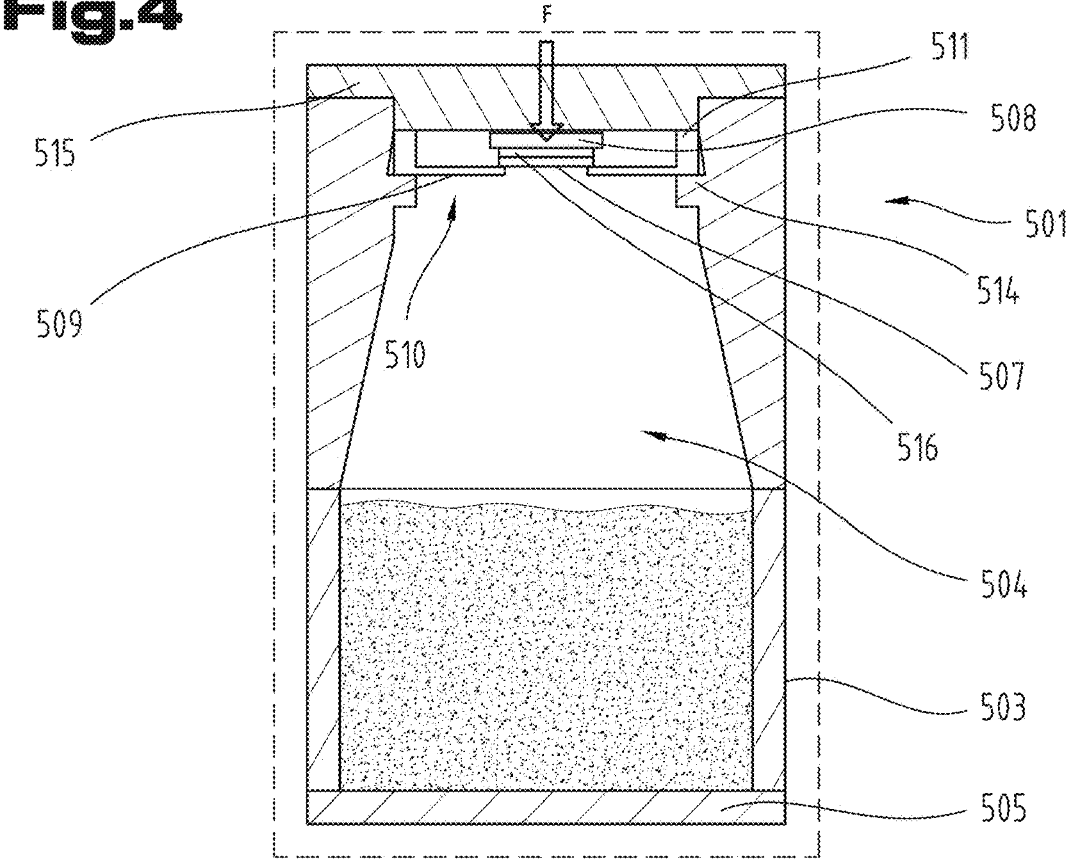
FIG. 4 a section through a crucible of a second variant of a device according to the invention.

According to FIGS. 3 and 4, the holding section 509 may be formed at least by a section of the mount 510 having an annular or tubular base body 511, the section facing a longitudinal central axis of the crucible, wherein the holding section 509 protrudes from the base body 511. The mount 510 may be screwed into the crucible 502 as is shown in FIG. 3, or inserted as is shown in FIG. 4.

According to the embodiment shown in FIG. 3, the mount 510 may have an external thread 512 on a lateral surface of the base body 511, wherein a lateral surface delimiting the opening may have an internal thread 513 corresponding to the external thread.

According to FIG. 4, the mount 510 inserted into the crucible may be supported on a projection 514 of the crucible 502. The projection 514 may be designed, for example, to extend circumferentially around the opening of the opening section 506.

The weighting mass 508 may be arranged between the seed crystal layer 507 and a cover 515 of the crucible 502, wherein the weighting mass 508 and the cover 515 are formed separately from one another. The weighting mass 508 is preferably arranged loosely between the cover 515 and the seed crystal layer 507.

The seed crystal layer 507 may be designed as a mechanically self-supporting layer or also be applied to a carrier substrate 516. If the seed crystal layer 507 is applied to a carrier substrate 516, the weighting mass 508 may rest on the carrier substrate 516. Graphite has proven particularly suited for being the carrier substrate.

The weighting mass 508 and/or the mount 510 may be made of metal, ceramics, mineral or plastics. Fireproof materials, carbides, oxides, or nitrides, for example, have proven particularly suitable.

Finally, as a matter of form, it should be noted that for ease of understanding of the structure, elements are partially not depicted to scale and/or are enlarged and/or are reduced in size.

LIST OF REFERENCE NUMBERS

401 Furnace
402 Chamber
403 Crucible
404 Cover
405 Seed crystal
406 Bottom section
407 Base material
408 Heater
409 Insulation
501 Device
502 Crucible
503 Lateral surface
504 Accommodation space
505 Bottom section

506 Opening section
507 Seed crystal layer
508 Weighting mass
509 Holding section
510 Mount
511 Base body
512 External thread
513 Internal thread
514 Projection
515 Cover
516 Carrier substrate

The invention claimed is:

1. A device (501) for growing single crystals, comprising a crucible (502), wherein the crucible (502) defines an outer lateral surface (503) and moreover delimits an accommodation space (504) with an axial extension between a bottom section (505) and an opening section (506), wherein the accommodation space (504) is designed for growing the crystals, wherein the device comprises at least one seed crystal layer (507), wherein the seed crystal layer (507) is weighted down by a weighting mass (508) on a side facing away from the accommodation space (504) and is fixed in position against at least one holding section (509) of the crucible, wherein the at least one seed crystal layer (507) is applied to a carrier substrate, and the weighting mass (508) rests on the carrier substrate, and wherein the carrier substrate is formed from graphite.

2. The device according to claim 1, wherein the seed crystal layer (507) contacts the at least one holding section (509) with at least an outer edge region.

3. The device according to claim 2, wherein the at least one holding section (509) is designed so as to extend circumferentially around an opening (510) of the opening section (506).

4. The device according to claim 2, wherein the at least one holding section (509) is formed at least by a section of a mount (510) having an annular or tubular base body (511), the section facing a longitudinal central axis of the crucible, wherein the at least one holding section (509) projects from the base body (511).

5. The device according to claim 1, wherein the weighting mass (508) is arranged between the seed crystal layer (507) and a cover (514) of the crucible (502), wherein the weighting mass (508) and the cover (514) are formed separately from one another.

6. The device according to claim 5, wherein the weighting mass (508) is arranged loosely between the cover (514) and the seed crystal layer (507).

7. The device according to claim 4, wherein the weighting mass (508) and/or the mount (510) are made of metal, ceramics, mineral or plastics.

8. The device according to claim 1, wherein the crucible (502) is arranged in a chamber of an inductively heated furnace.

9. The device according to claim 1, wherein the single crystals are single crystals of silicon carbide and wherein the seed crystal layer (507) is fixed in position against the at least one holding section (509) of the crucible only by the weight force of the weighting mass (508).

10. The device according to claim 4, wherein the weighting mass (508) and/or the mount (510) are made of fireproof materials, carbides, oxides, or nitrides.

* * * * *